United States Patent [19]

Futami

[11] Patent Number: 5,087,955
[45] Date of Patent: Feb. 11, 1992

[54] INPUT-OUTPUT CIRCUIT OF REDUCED DEVICE AREA FOR SEMICUSTOM SEMICONDUCTOR INTEGRATED CIRCUIT

[75] Inventor: Haruji Futami, Tokyo, Japan
[73] Assignee: NEC Corporation, Tokyo, Japan
[21] Appl. No.: 564,232
[22] Filed: Aug. 8, 1990
[30] Foreign Application Priority Data Aug. 8, 1989 [JP] Japan .................................. 1-205925

[51] Int. Cl.⁵ .......................................... H01L 27/02
[52] U.S. Cl. ........................................ 357/41; 357/40
[58] Field of Search ............... 357/41, 40, 68, 45, 357/238, 23.13; 307/475

[56] References Cited

U.S. PATENT DOCUMENTS

| | | | |
|---|---|---|---|
| 3,983,543 | 9/1976 | Cordaro | 307/475 X |
| 4,591,894 | 5/1986 | Kawakami et al. | 357/68 X |
| 4,908,531 | 3/1990 | Podell et al. | 307/475 X |
| 4,945,395 | 7/1990 | Suehiro | 357/40 |

Primary Examiner—Rolf Hille
Assistant Examiner—R. Potter
Attorney, Agent, or Firm—Sughrue, Mion, Zinn Macpeak & Seas

[57] ABSTRACT

A peripheral block of a semicustom integrated circuit comprises one input/output pad formed on a peripheral portion of a substrate and an N-channel MOS transistor formed in proximity of the input/output pad. A wiring conductor extends from the input/output pad to an internal circuit, and one the way, is connected to a drain region of the N-channel MOS transistor. A source and a gate of the N-channel MOS transistor is connected to a ground so as to function as a diode for protecting a large voltage inputted to the input/output pad, from the internal circuit.

8 Claims, 5 Drawing Sheets

400 INTEGRATED CIRCUIT CHIP

INPUT-OUTPUT CIRCUIT OF REDUCED DEVICE AREA FOR SEMICUSTOM SEMICONDUCTOR INTEGRATED CIRCUIT

BACKGROUND OF THE INVENTION

1. Field of the Invention

The present invention relates to a semicustom semiconductor integrated circuit, and more specifically, an input/output circuit for use in a peripheral block of a semicustom semiconductor integrated circuit such as a gate array IC (integrated circuit) composed of CMOS (complementary metal-oxide-semiconductor) transistors.

2. Description of Related Art

In the prior art, a gate array IC composed of CMOS transistors includes not only an internal CMOS gate array but also a peripheral block which includes power supply pads, signal input/output pads and various elements for constituting external signal input circuits, internal signal output circuits, and signal input/output circuits. For this purpose, each unitary circuit of the peripheral block includes a bonding pad, a resistor and a diode used for constituting an external signal input circuit, a pair of P-channel transistor and N-channel transistor having a large channel width for constituting the output circuit, and a group of P-channel MOS transistors and N-channel MOS transistors which have a channel width similar to those of transistors of an internal CMOS gate array and which are used to constitute a different kind of peripheral circuit.

In one typical unitary circuit of a peripheral block of conventional semicustom CMOS gate array ICs, an input/output pad, a polysilicon resistor and a junction diode used for forming an input protection circuit, an N-channel MOS transistor and a P-channel MOS transistor of a large size used to form an output buffer, and a group of P-channel transistors and another group of N-channel transistors used for realizing various functions for an input or output circuit, are arranged in a peripheral region of an IC chip in the name order starting from a peripheral edge portion of the IC chip towards an internal CMOS gate array of the IC chip. In this connection, it should be noted that the polysilicon resistor and the junction diode are of a relatively large size in order to ensure an input protection function.

In the case of forming an input protection circuit in the above mentioned unitary circuit of the peripheral block, the input/output pad is connected to one end of the polysilicon resistor, which is connected at its other end to one end of a cathode region of the junction diode. The other end of the cathode region of the junction diode is connected to an internal circuit through a wiring conductor. Thus, the input protection circuit composed of the polysilicon resistor connected at its one end to the input pad and a resistor composed of the cathode region of the junction diode and connected at its one end to the other end of the polysilicon resistor and at its other end to the internal circuit. A connection node between the polysilicon resistor and the resistor composed of the cathode region of the junction diode is grounded to the junction diode itself which is in a reversed direction from the connection node toward the ground. In the above mentioned input protection circuit, however, the N-channel MOS transistor and the P-channel MOS transistor of the large size are not used at all and put in an unconnected condition.

On the other hand, in the case of forming an output circuit in the above mentioned unitary circuit of the peripheral block, the input/output pad is connected commonly to a drain of the N-channel MOS transistor of the large size and a drain of the P-channel MOS transistor of the large size. A source of the P-channel MOS transistor of the large size is connected to a high voltage line, and a source of the N-channel MOS transistor of the large size is grounded or connected to a low voltage line. Gates of the N-channel MOS transistor and the P-channel MOS transistor of the large size are commonly connected to an output of an internal circuit. Thus, a CMOS inverter having a high current capacity is formed of the N-channel MOS transistor and the P-channel MOS transistor of the large size. In this case, however, the polysilicon resistor and the junction diode are not used at all and put in an unconnected condition.

As seen from the above, each unitary circuit of the peripheral block of the conventional semicustom CMOS gate array ICs has not only the input/output pad, but also the polysilicon resistor and the junction diode used for forming the input protection circuit, and the N-channel MOS transistor and the P-channel MOS transistor of the large size used to form the output buffer. Therefore, the peripheral block requires a substantial device area, since not only the N-channel MOS transistor and the P-channel MOS transistor used to form the output buffer are of the large size but also the polysilicon resistor and the junction diode must have a relatively large size allowing a large current to flow therethrough for protecting the internal circuit from a large voltage. As a result, in the case that the number of internal circuits is small but the number of peripheral blocks are large, a ratio of the area of all the peripheral blocks to an area of the whole IC chip inevitably becomes large. Namely, the integration density cannot be elevated.

SUMMARY OF THE INVENTION

Accordingly, it is an object of the present invention to provide a semicustom semiconductor integrated circuit which has overcome the above mentioned defect of the conventional one.

Another object of the present invention is to provide a unitary circuit of a peripheral block of a semicustom semiconductor integrated circuit, which unitary circuit has a reduced device area and a reduced number of required elements but can constitute not only an output buffer but also an input protection circuit.

The above and other objects of the present invention are achieved in accordance with the present invention by a peripheral block of a semicustom integrated circuit comprising one input/output pad formed on a peripheral portion of a substrate, and an N-channel MOS transistor formed in proximity of the input/output pad and having a drain region connected to the input/output pad and an internal circuit, a source and a gate of the N-channel MOS transistor being connected to a ground.

According to another aspect of the present invention, there is provided an integrated circuit including a plurality of unitary circuits formed on a semiconductor substrate, each of the unitary circuits including an electrode pad to be connected to an external circuit and at least one MOS transistor, wherein a first unitary circuit of the unitary circuits includes a first wiring for connecting the electrode pad of the first unitary circuit to an internal circuit a, second wiring for connecting a source-drain path of the MOS transistor of the first unitary circuit between the first wiring and a voltage supply wiring, and a third wiring for connecting a gate of the MOS transistor to the voltage supply wiring, so that the first unitary circuit constitutes an input circuit for the integrated circuit, and wherein a second unitary circuit of the unitary circuits includes a fourth wiring for connecting a gate of the MOS transistor of the second unitary circuit to an internal circuit, and a fifth wiring for connecting a source-drain path between the electrode pad of the second unitary circuit and the voltage supply wiring, so that said second unitary circuit constitutes an output circuit for the integrated circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
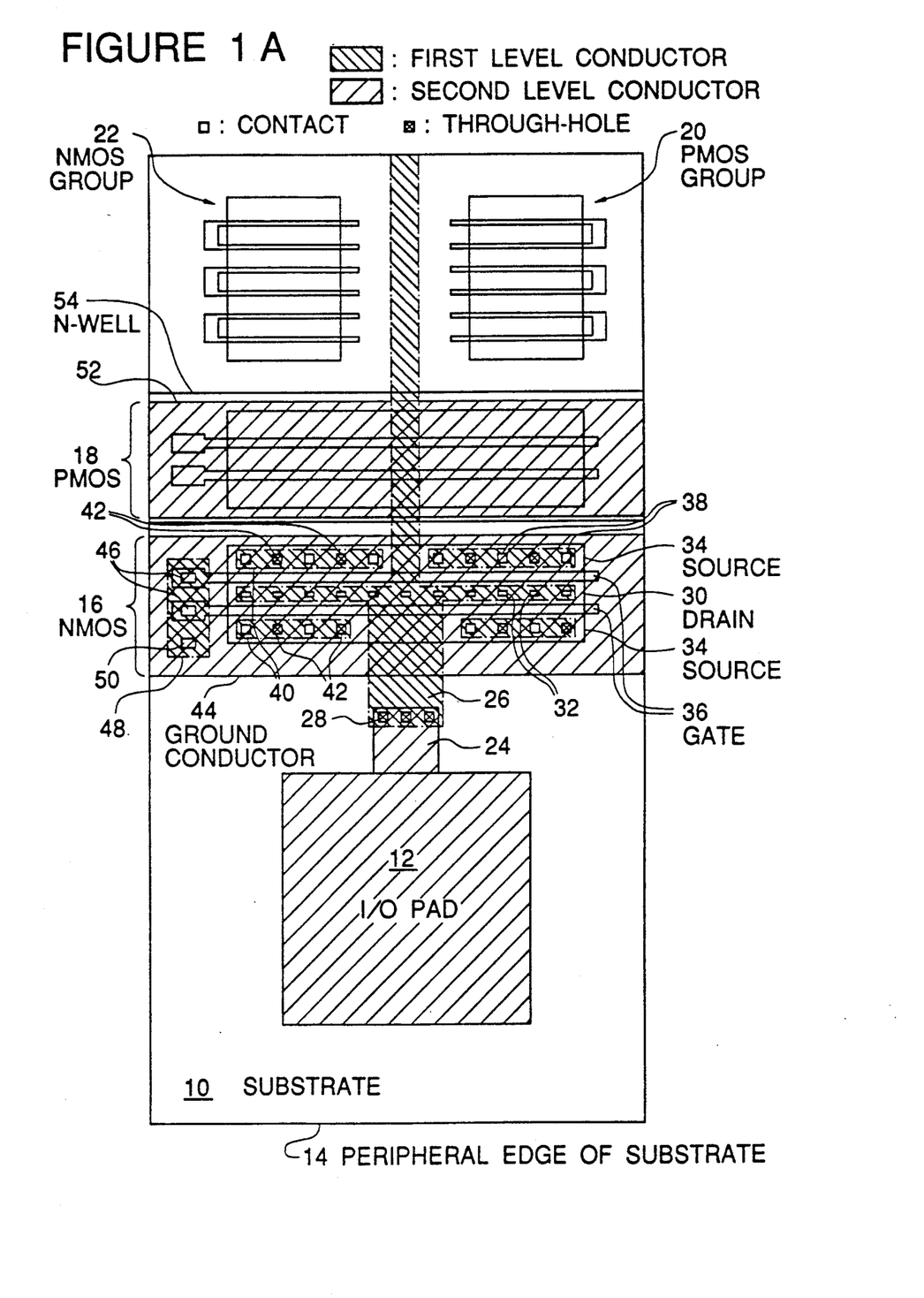
FIG. 1A is a layout pattern diagram of one embodiment of the unitary circuit of the peripheral block of the semicustom semiconductor integrated circuit in accordance with the present invention.

Referring to FIG. 1, there is shown a layout pattern diagram of one embodiment of one unitary circuit of the peripheral block of the semicustom semiconductor integrated circuit in accordance with the present invention. Reference Numeral 10 designates a substrate which is for example a P-type silicon substrate. However, it should be noted that the shown substrate 10 is a mere portion of a peripheral portion of the IC chip substrate. The unitary circuit of the peripheral block includes one input/output pad 12 formed on the substrate 10 in proximity of a peripheral edge 14 of the substrate 10. The unitary circuit of the peripheral block also includes an N-channel MOS transistor 16 located at the inside of the input/output pad 12, a P-channel MOS transistor 18 located at the inside of the N-channel MOS transistor 16, and a group 20 of P-channel transistors and another group 22 of N-channel transistors located at the inside of the P-channel MOS transistor 18. In FIG. 1A and the following FIGS. 2A and 3A, a hatching composed of parallel slant lines extending from the upper left to the lower right designates a first level conductor or wiring, and a hatching composed of parallel slant lines extending from the upper right to the lower left designates a second level conductor or wiring which is located at a level above the level of the first level conductor. In addition, small square boxes having a white blank indicate an interlayer-connection through-hole (conductor) for connecting between a first level conductor and a second level conductor, and small square boxes having a cross mark therein designate a contact for connecting between a first level conductor and a region formed in the substrate or a conductor formed on the substrate. However, various insulator layers including a gate oxide, a first level insulator layer which is deposited to cover a principal surface of the substrate and on which a first level conductor is deposited, a second level insulator layer which is deposited to cover the first level conductors and on which is a second level conductor is deposited, and an overcoating insulating layer covering the second level conductor are not shown in FIG. 1A and the succeeding FIGS. 2A and 3B.

In the embodiment shown in FIG. 1A, the input/output pad 12 forms an input terminal. The pad 12 has an second level wiring 24 extending from an inner side edge of the pad 12, and the second level wiring 24 is connected to a first level wiring 26 by interlayer-connection through-hole conductors 28. The first level wiring 26 extends over an elongated drain region 30 of the N-channel MOS transistor 16 extending in parallel to the peripheral edge of the substrate 10. The first level wiring 26 is connected to the drain region 30 through a number of contacts 32. The first level wiring 26 also extends toward an internal circuit (not shown) so as to pass through a space between the P-channel transistor group 20 and the N-channel transistor group 22.

A source region 34 of the N-channel MOS transistor 16 is formed at each side of the drain region 30 so as to extend along the elongated drain region 30 and apart from the elongated drain region 30 so that a channel region is formed between the elongated drain region 30 and each of the source regions 34. A gate electrode 36 is formed on each channel region through an gate oxide (not shown). The source regions 34 are connected through a number of contacts 38 to first level conductors 40 which are formed to extend over the source regions 34 excluding a region above which the first level wiring 26 passes. The first level conductors 40 are connected by a number of interlayer-connection through-holes 42 to a second level conductor layer 44, which is formed to cover a whole of the N-channel transistor 16 and which is connected to ground or a low voltage line. Each of the gate electrodes 36 is connected at its one ends through a contact 46 to a wiring conductor 48 of the first level, and the wiring conductor 48 is connected to the P-type substrate 10 through a contact 50. Although not shown, the P-type substrate 10 itself is connected to a ground level wiring so that the substrate is properly biased. Therefore, it is equivalently realized that a resistor formed of a resistive component of the substrate 10 itself is connected between each gate 36 and the ground.

On the other hand, a second level conductor 52, which is biased to a high voltage supply potential, is formed to cover a whole of the P-channel transistor 18 which is formed within an N-well 54 formed in the P-type substrate 10, but the P-channel transistor 18 is not connected to any element in the peripheral block shown in FIG. 1A. In this embodiment, therefore, the second level conductor 52 functions only as a portion of a high voltage supply potential wiring for other unitary circuits of the same peripheral block or other peripheral blocks.

Figure 1B:
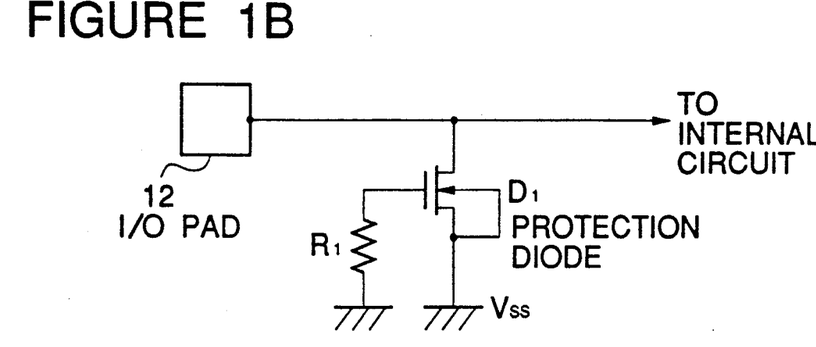
FIG. 1B is a circuit diagram of an input protection circuit realized in the layout pattern diagram shown in FIG. 1A.

Referring to FIG. 1B, there is shown an equivalent circuit of the above mentioned unitary circuit of the peripheral block shown in FIG. 1A. As seen from FIG. 1B, the input/output pad 12 is connected to an internal circuit (not shown) through a connection line which is grounded through a protection diode D1 composed of the N-channel transistor 16 having a gate connected to the ground through a resistor R1. The resistor R1 is formed of a resistance component of the semiconductor substrate 10 itself as mentioned above.

With the above mentioned arrangement of the input protection circuit, when a voltage lower than the ground level $V_{SS}$ is applied to the input/output pad 12, when the applied voltage reaches a forward direction ON voltage of a PN junction formed by a substrate region (P-type) and the drain region (N-type) of the N-channel MOS transistor, a current flows from the ground through the PN junction to the input/output pad 12. As a result, a potential of the input/output pad 12 is clamped to a level which is lower than the ground level $V_{SS}$ by the forward direction ON voltage of the PN junction. Therefore, the internal circuit is protected.

On the other hand, if a voltage higher than the high voltage supply potential $V_{DD}$ is applied to the input/output pad 12, the junction between the substrate region and the drain region of the N-channel MOS transistor is reversely biased. In this reversed biased condition, if the voltage applied to the input/output pad 12 reaches a breakdown voltage $BV_{DS}$ between the drain and the source of the N-channel MOS transistor, the protection diode D1 is broken down, and therefore, a current flows from the input/output pad 12 to the semiconductor region 46 biased to the ground $V_{SS}$. In addition, the breakdown current also forwardly flows through a diode (not shown) connected between the high voltage supply potential $V_{DD}$ and the ground $V_{SS}$. As a result, the potential of the input/output pad 12 is clamped to a level which is a sum of the breakdown voltage of the protection diode D1 and the forward direction voltage of the diode connected between the high voltage supply potential $V_{DD}$ and the ground $V_{SS}$.

Thus, if the input protection circuit has the protection diode formed by the N-channel transistor as mentioned above, it has been found that the input protection circuit has a large protection capability, namely an electrostatic breakdown voltage higher than that of a conventional input protection circuit composed of a polysilicon resistor and a junction diode, provided that the same device area is assigned. For example, in a manufacturing process for realizing a source/drain region of N-channel MOS transistors having a junction depth of 0.5 μm and a gate oxide having a thickness of 300 Å, a protection junction diode will have a breakdown voltage of 15 to 20 V. On the other hand, it was confirmed by using a so-called "MIL type" electrostatic breakdown voltage test circuit that if the N-channel MOS transistor is formed to have a channel length of 2.5 μm and a channel width of 200 μm, the protection diode constituted of the N-channel MOS diode has an electrostatic breakdown voltage of 2000 V or more. It is possible to fabricate the N-channel MOS transistor of the above mentioned size in a peripheral block of semicustom gate array ICs. In addition, it is also possible to determine the size of the N-channel MOS transistor which can be used not only to form the above mentioned input protection circuit but also to form an output circuit capable of giving a sufficient driving power.

As seen from the above mentioned elevation, if the MOS transistor of a large size used for only an output circuit in a conventional peripheral block of the semicustom gate array ICs is used as an input protection diode in the input protection circuit, it is possible to omit the polysilicon resistor and the junction diode which would have been required in the conventional peripheral block of the semicustom gate array ICs for constituting the input protection circuit.

Figure 2A:
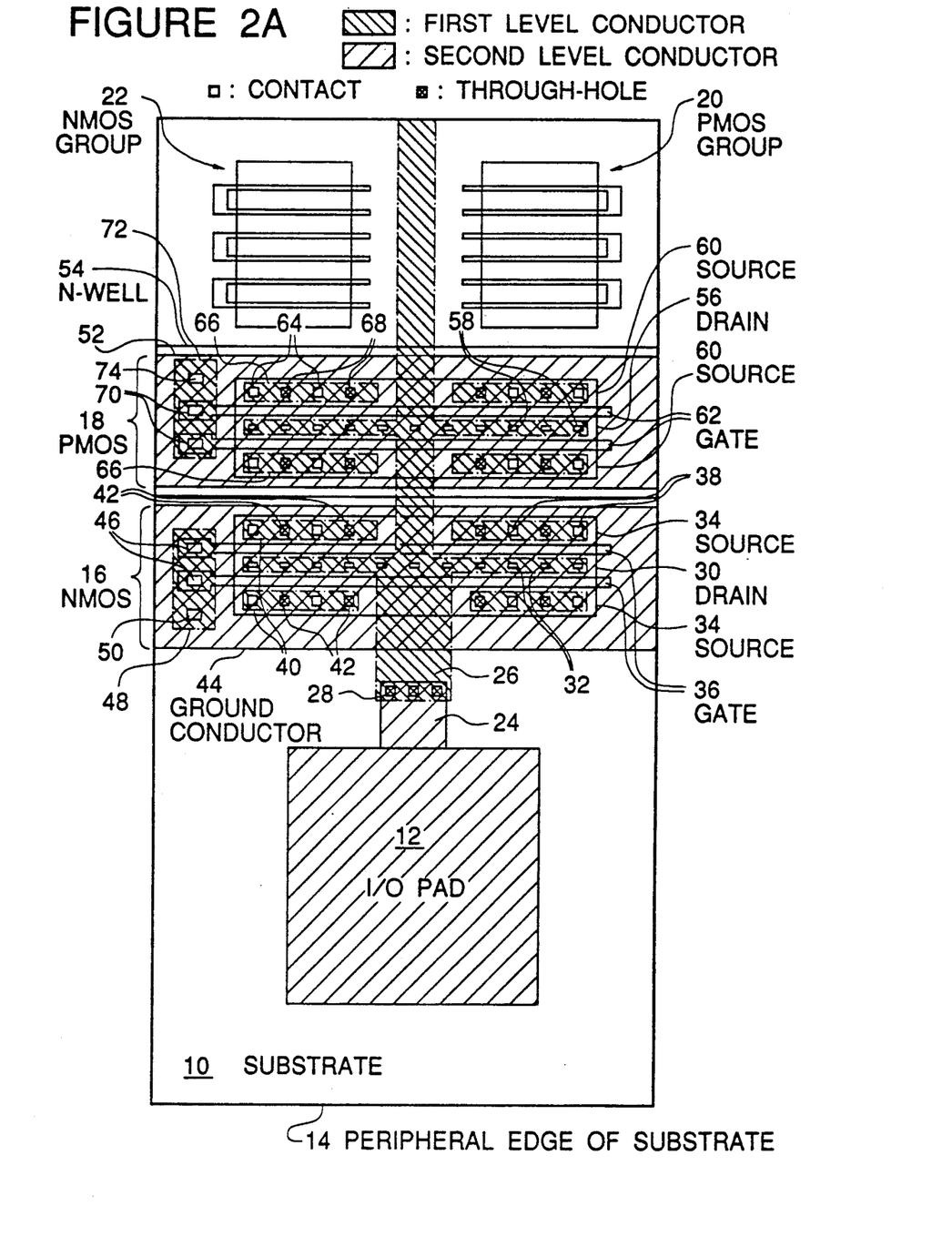
FIG. 2A is a layout pattern diagram similar to FIG. 1A but illustrating a second embodiment of the unitary circuit of the peripheral block of the semicustom semiconductor integrated circuit in accordance with the present invention.

Referring to FIG. 2A, there is a layout pattern diagram illustrating a second embodiment of the unitary circuit of the peripheral block of the semicustom semiconductor integrated circuit in accordance with the present invention. In FIG. 2A, elements similar to those shown in FIG. 1A are given the same Reference Numerals, and explanation thereof will be omitted for simplification of explanation.

The P-channel transistor 18 is formed in a N-well 54 formed in the substrate 10 adjacent to the N-channel MOS transistor 16. The first level wiring 26 also extends over an elongated drain region 56 formed in the N-well 54 of the P-channel MOS transistor 18, and is connected to the drain region 56 through a number of contacts 58.

A source region 60 of the P-channel MOS transistor 18 is formed at each side of the drain region 56 along the elongated drain region and apart from the elongated drain region so that a channel region is formed between the elongated drain region 56 and each of the source regions 60. A gate electrode 62 is formed on each channel region through an gate oxide (not shown). The source regions 60 are connected through a number of contacts 64 to first level conductors 66 which are formed to extend over the source regions 60 excluding a region above which the first level wiring 26 passes. The first level conductors 66 are connected by a number of interlayer-connection through-holes 68 to the second level conductor layer 52 which is formed to cover a whole of the P-channel transistor 18 and which is connected to the high voltage line.

Each of the gate electrodes 62 is connected at its one ends through a contact 70 to a wiring conductor 72 of the first level, and the first level wiring conductor 72 is connected through a contact 74 to the N-well 54. Although not shown, the N-well 54 is connected to a wiring for a high voltage $V_{DD}$ so that the N-well 54 is properly biased. Therefore, between each gate electrode 62 and the high voltage $V_{DD}$, there is equivalently connected a resistor constituted of a resistive component of the N-well 54 itself.

Figure 2B:
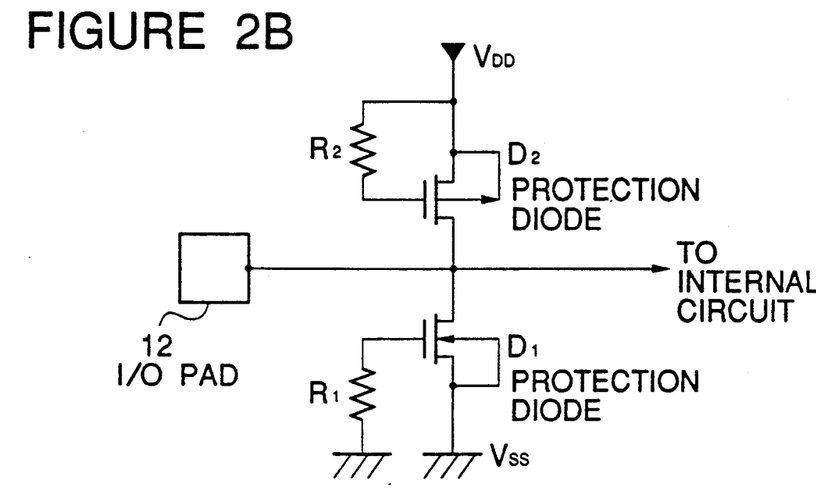
FIG. 2B is a circuit diagram of an input protection circuit realized in the layout pattern diagram shown in FIG. 2A.

Referring to FIG. 2B, there is shown an equivalent circuit of the above mentioned unitary circuit of the peripheral block shown in FIG. 2A. As seen from FIG. 2B, the input/output pad 12 is connected to an internal circuit (not shown) through a connection line which is connected to the ground $V_{SS}$ through a protection diode D1 composed of the N-channel transistor 16 and to the high voltage $V_{DD}$ through another protection diode D2 composed of the P-channel transistor 18. A gate of the N-channel transistor 16 is connected to the ground $V_{SS}$ through a resistor R1 which is composed of a resistance component of the substrate 10 itself. A gate of the P-channel transistor 18 is connected to the high voltage $V_{SS}$ through a resistor R2 which is formed of a resistance component of the N-well 54 itself.

The above mentioned input protection circuit will operate similarly to the first embodiment shown in FIG. 1A, when a voltage lower than the ground level $V_{SS}$ by a magnitude which is not less than a forward direction ON voltage of a PN junction formed by a substrate region (P-type) and the drain region (N-type) of the N-channel MOS transistor, is applied to the input/output pad 12. On the other hand, if a voltage higher than the high voltage supply potential $V_{DD}$ is applied to the input/output pad 12, when the voltage applied to the input/output pad 12 become higher than the high voltage supply potential $V_{DD}$ by a forward direction ON voltage of a PN junction formed by a substrate region (N-well 54) and the drain region (P-type) of the P-channel MOS transistor, a current forwardly flows from the input/output pad 12 through the P-type drain region 56 of to the N-well 54. As a result, a potential of the input/output pad 12 is clamped to a level which is higher than the high voltage supply level $V_{DD}$ by the forward direction ON voltage of the PN junction. Therefore, the internal circuit is protected.

In the second embodiment, assuming that the forward direction ON voltage of the protection diode is 0.7 V, the voltage range of the input/output pad 12 will have a lower limit of "the ground level (minimum potential) minus 0.7 V" and an upper limit of "the high voltage supply potential (maximum potential) plus 0.7 V". Therefore, a positive and reliable protection can be obtained. If an input voltage signal applied to the input/output pad 12 often exceeds the above mentioned upper limit, or if an input voltage signal is a high frequency signal adversely influenced by a parasitic capacitance of the input circuit, the first embodiment is rather preferable.

Figure 3A:
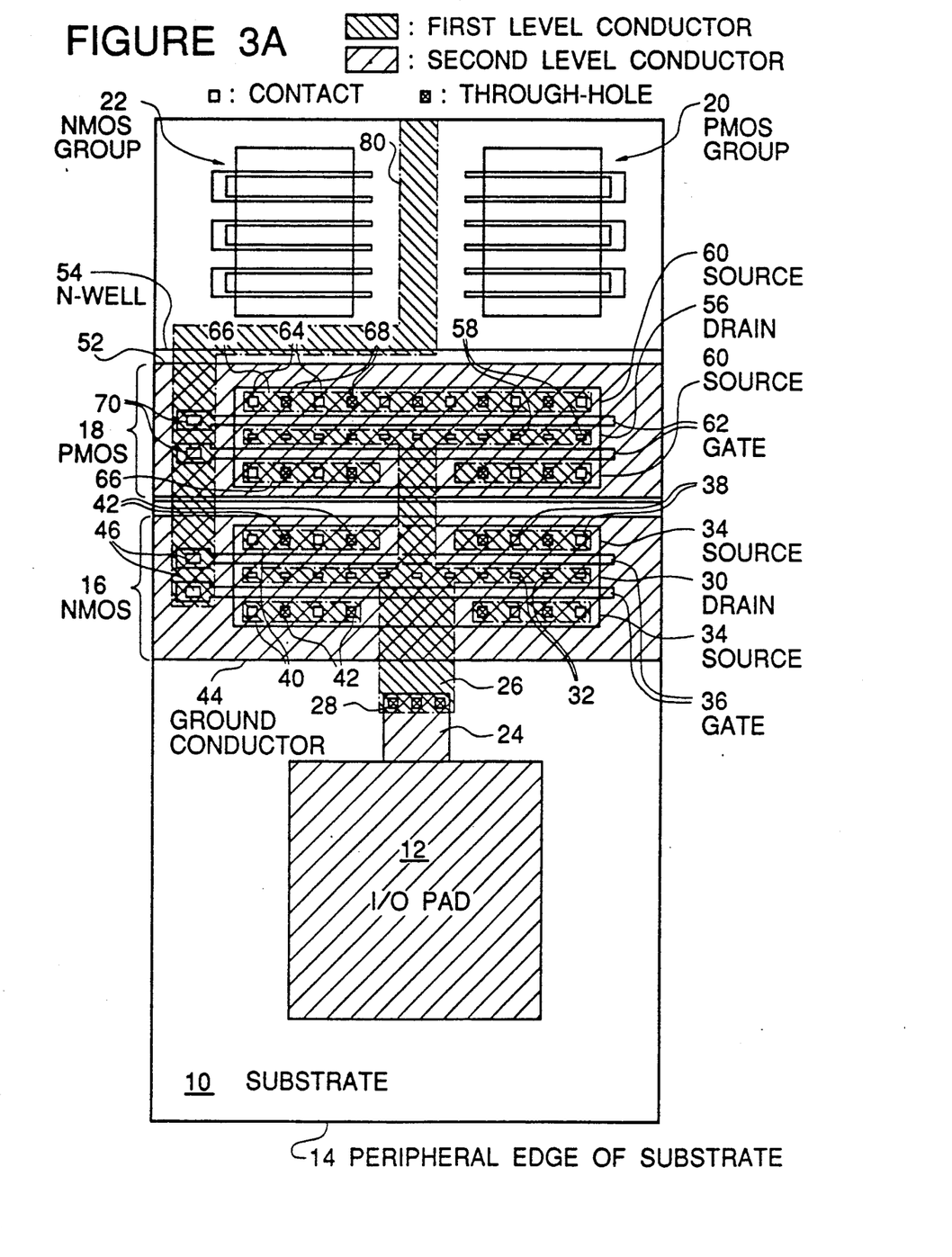
FIG. 3A is a layout pattern diagram similar to FIG. 1A but illustrating a third embodiment of the unitary circuit of the peripheral block of the semicustom semiconductor integrated circuit in accordance with the present invention.

Referring to FIG. 3A, there is shown a layout pattern diagram for illustrating the fact that the unitary circuit of the peripheral block of the semicustom semiconductor integrated circuit in accordance with the present invention can be used for constituting an output circuit. In FIG. 3A, elements similar to those shown in FIG. 2A are given the same Reference Numerals, and explanation thereof will be omitted for simplification of explanation.

The gate electrodes 36 and 62 of the N- and P-channel transistors 16 and 18 are connected through the contacts 46 and 70 to a first level conductor 80 to which a signal is applied from an internal circuit (not shown). Therefore, the semiconductor regions 48 and 72 are not connected to the gate electrodes 36 and 62 of the N- and P-channel transistors 16 and 18.

Figure 3B:
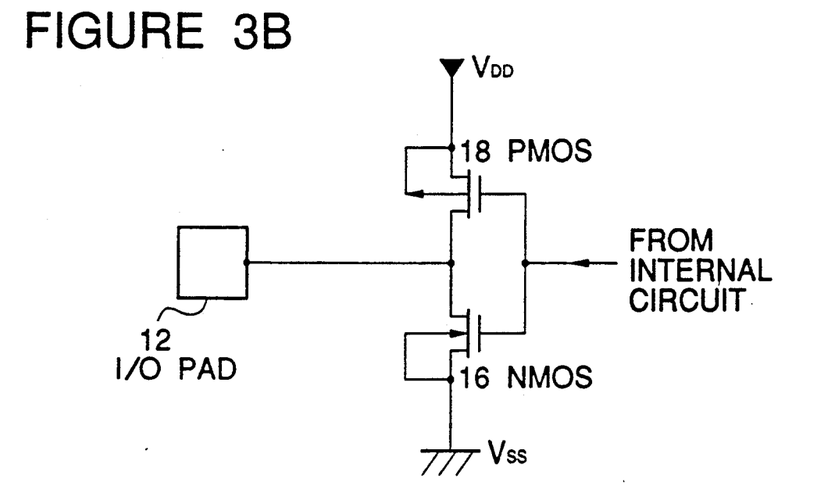
FIG. 3B is a circuit diagram of an output circuit realized in the layout pattern diagram shown in FIG. 3A.

Thus, there is formed an output buffer of the CMOS inverter type expressed by an equivalent circuit diagram shown in FIG. 3B.

Figure 4:
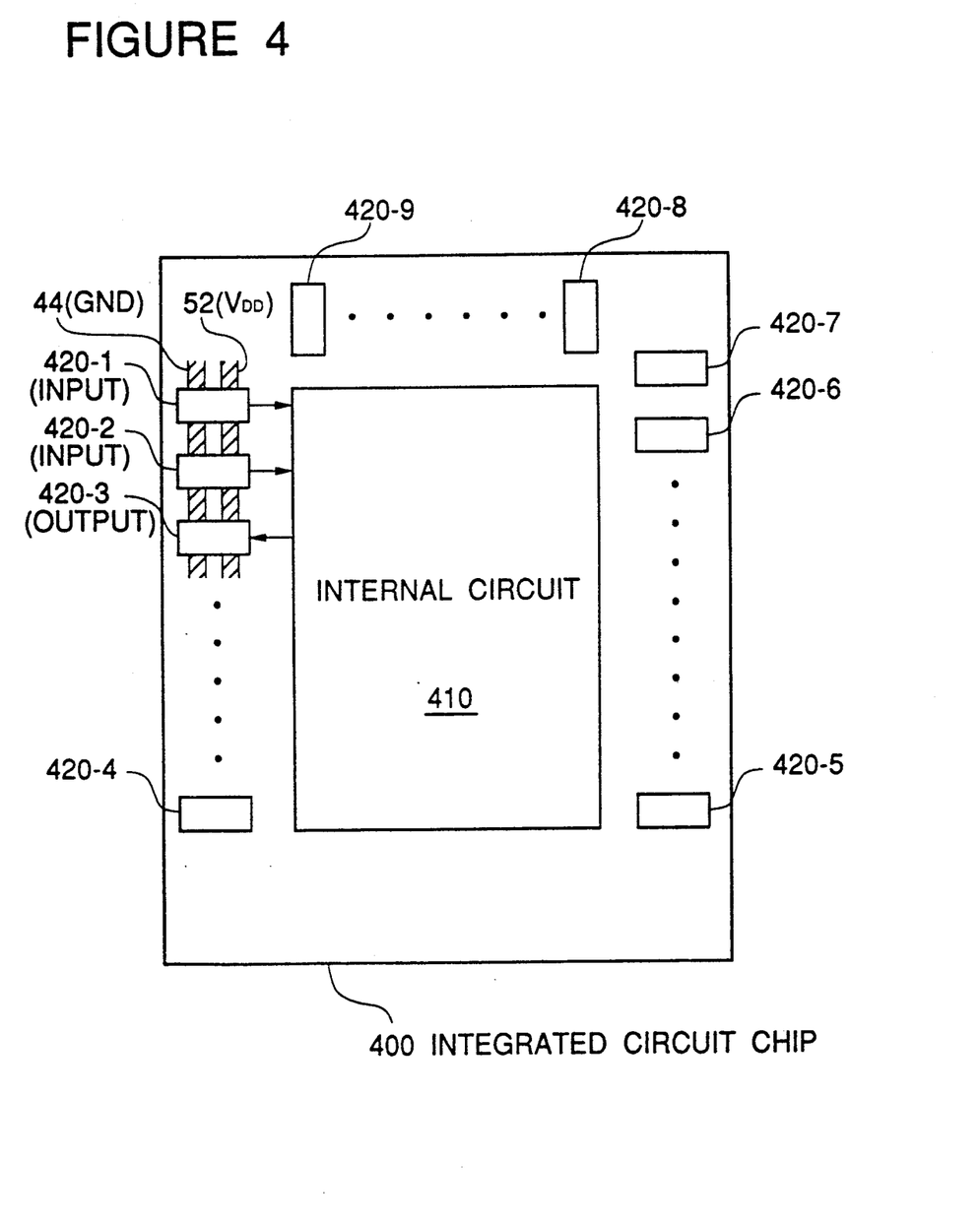
FIG. 4 is a diagrammatic plan view of an example of an integrated circuit incorporating therein the peripheral block of the semicustom semiconductor integrated circuit in accordance with the present invention.

Referring to FIG. 4, there is shown an integrated circuit chip 400 incorporating therein unitary circuits for the peripheral block as mentioned above. Namely, the chip 400 includes a number of unitary circuits 420 formed along a peripheral edge of the substrate so as to surround an internal circuit 410 (for example, a gate array). In FIG. 4, only nine unitary circuits 420-1 to 420-9 are shown. As explained hereinbefore with reference to FIGS. 1A to 3A, each of the unitary circuits 420-1 to 420-9 includes an input/output pad 12, an N-channel MOS transistor 16, a P-channel MOS transistor 18, a NMOS group 22 and a PMOS group 20. Therefore, the N-channel MOS transistors 16 of all the unitary circuits are formed to have the same transistor size, and the P-channel MOS transistors 18 of all the unitary circuits are formed to have the same transistor size.

In each of the unitary circuits, whether the unitary circuit 420 is used or wired as the input circuit (FIGS. 1 or 2) or as the output circuit (FIG. 3) is determined by a wiring pattern of the first and second level wiring conductors, dependently upon a function to be executed by the internal circuit 410. For example, the unitary circuits 420-1 and 420-2 are used as the input circuit, and therefore, are wired as shown in FIGS. 1A or 2A. On the other hand, the unitary circuit 420-3 is used as the output circuit and therefore wired as shown in FIG. 3A. The unitary circuits used as the input circuit and the unitary circuits used as the output circuits are arranged in a mixed condition, and the N-channel MOS transistor 16 and the P-channel MOS transistor 18 of each unitary circuit are used in the input circuit as the transistor for constituting the input protection diode and in the output circuit as the transistor for constituting the CMOS inverter.

In the above mentioned description, the present invention has been explained on the semicustom gate array ICs, but it would be apparent that the present invention can be applied to other semicustom ICs.

As seen from the above, the present invention is characterized in that, since a MOS transistor or MOS transistors of a large size used for only an output circuit in a conventional peripheral block of the semicustom gate array ICs are used as an input protection diode or input protection diodes in the input protection circuit, not only a sufficient high electrostatic breakdown voltage can be obtained, but also it is possible to omit the polysilicon resistor and the junction diode which would have been required in the conventional peripheral block of the semicustom gate array ICs for constituting the input protection circuit. Therefore, according to the present invention, it is possible to reduce a device area of the peripheral block in comparison with the conventional one, and therefore, to realize a semicustom semiconductor integrated circuit having an integration density higher than that of the conventional one.

The invention has thus been shown and described with reference to the specific embodiments. However, it should be noted that the present invention is in no way limited to the details of the illustrated structures but changes and modifications may be made within the scope of the appended claims.

I claim:

1. A peripheral block of a semicustom integrated circuit comprising:
    one input/output pad formed on a peripheral portion of a substrate, an N-channel MOS transistor formed in proximity of said input/output pad and having a drain region connected to said input/output pad and an internal circuit, a source and a gate of said N-channel MOS transistor being connected to a ground;
    a first level conductor connected to said input/output pad and extending toward said internal circuit through a region in which said N-channel MOS transistor is formed, said conductor being connected to said drain region of said N-channel MOS transistor above said drain region of said N-channel MOS transistor by means of contacts; and
    a second level conductor is positioned above said first level conductor and to cover said N-channel MOS transistor, said second level conductor being connected to said source region of said N-channel MOS transistor by means of through-holes and connected to the ground level;

wherein said gate of said N-channel MOS transistor is connected through a contact to said substrate and said substrate itself is grounded so that said gate of said N-channel MOS transistor is grounded through a resistive component of said substrate itself.

2. A peripheral block of a semicustom integrated circuit comprising one input/output pad formed on a peripheral portion of a substrate, a wiring conductor extending from said input/output pad towards an internal circuit, an N-channel MOS transistor formed in proximity of said input/output pad and in the path of said wiring conductor, a drain region of said N-channel MOS transistor being connected to said wiring conductor, a source and a gate of said N-channel MOS transistor being connected to a ground, and an P-channel MOS transistor formed in an N-well formed in proximity of said N-channel MOS transistor and in the path of said wiring conductor, a drain region of said P-channel MOS transistor being connected to said wiring conductor, a source and a gate of said P-channel MOS transistor being connected to a high voltage line.

3. A peripheral block of a semicustom integrated circuit as claimed in claim 2 wherein said gate of said N-channel MOS transistor is connected to the ground through a resistor and said gate of said P-channel MOS transistor being connected to the high voltage line through a resistor.

4. A peripheral block of a semicustom integrated circuit as claimed in claim 3 wherein said wiring conductor is composed of a first level conductor connected to said input/output pad and extending toward said internal circuit through a region in which said N-channel MOS transistor is formed and through another region in which said P-channel transistor is formed, said first level conductor being connected to said drain region of said N-channel MOS transistor above said drain region of said N-channel MOS transistor by means of contacts and to said drain region of said P-channel MOS transistor above said drain region of said P-channel MOS transistor by means of contacts.

5. A peripheral block of a semicustom integrated circuit as claimed in claim 4 further including a ground conductor positioned at a second level higher than said first level conductor and to cover said N-channel MOS transistor, said ground conductor being connected to said source region of said N-channel MOS transistor by means of through-holes and also connected to the ground level, and a high voltage conductor is positioned at a second level higher than said first level conductor and to cover said P-channel MOS transistor, said high voltage conductor being connected to said source region of said P-channel MOS transistor by means of through-holes and also connected to said high voltage line.

6. A peripheral block of a semicustom integrated circuit as claimed in claim 5 wherein said gate of said N-channel MOS transistor is connected through a contact to said substrate and said substrate itself is grounded so that said gate of said N-channel MOS transistor is grounded through a resistive component of said substrate itself, and wherein said gate of said P-channel MOS transistor is connected through a contact to said N-well and said N-well is connected to said high voltage conductor so that the said gate of said P-channel MOS transistor is connected to said high voltage conductor through a resistive component of said N-well itself.

7. An integrated circuit including a plurality of unitary circuits formed on a semiconductor substrate, each of said unitary circuits including an electrode pad to be connected to an external circuit and at least one MOS transistor, wherein a first unitary circuit of said unitary circuits includes a first wiring for connecting said electrode pad of said first unitary circuit to an internal circuit, a second wiring for connecting a source-drain path of said MOS transistor of said first unitary circuit between said first wiring and a voltage supply wiring, and a third wiring for connecting a gate of said MOS transistor to said voltage supply wiring, so that said first unitary circuit constitutes an input circuit for the integrated circuit, and wherein a second unitary circuit of said unitary circuits includes a fourth wiring for connecting a gate of said MOS transistor of said second unitary circuit to an internal circuit, and a fifth wiring for connecting a source-drain path between said electrode pad of said second unitary circuit and said voltage supply wiring, so that said second unitary circuit constitutes an output circuit for the integrated circuit.

8. An integrated circuit including first and second electrode pads, a first wiring for connecting said first electrode pad to an internal circuit, a first MOS transistor having a source-drain path connected between said first wiring and a voltage supply line and a gate electrically connected to said voltage supply line, a second MOS transistor having a source-drain path connected between said second electrode pad and said voltage supply line and having substantially the same size as that of said first MOS transistor, and a second wiring for connecting a gate of said second MOS transistor to an internal circuit.

* * * * *